United States Patent
Kong et al.

(10) Patent No.: US 10,000,844 B2
(45) Date of Patent: Jun. 19, 2018

(54) MAGNETIC FIELD GENERATOR, MAGNETRON CATHODE AND SPATTERING APPARATUS

(75) Inventors: Wei Kong, Anhui (CN); Zijing Lin, Anhui (CN); Ming Li, Anhui (CN); Bin Xie, Anhui (CN); Haiqian Wang, Anhui (CN); Yousong Jiang, Yokohama (JP); Ekishu Nagae, Yokohama (JP)

(73) Assignees: SHINCRON CO., LTD., Kanagawa (JP); UNIVERSITY OF SCIENCE AND TECHNOLOGY OF CHINA, Anhui (CN)

( * ) Notice: Subject to any disclaimer, the term of this patent is extended or adjusted under 35 U.S.C. 154(b) by 0 days. days.

(21) Appl. No.: 13/698,884

(22) PCT Filed: Aug. 30, 2011

(86) PCT No.: PCT/JP2011/069597
§ 371 (c)(1),
(2), (4) Date: Nov. 19, 2012

(87) PCT Pub. No.: WO2012/035970
PCT Pub. Date: Mar. 22, 2012

(65) Prior Publication Data
US 2013/0180851 A1  Jul. 18, 2013

(30) Foreign Application Priority Data
Sep. 13, 2010 (WO) .................. PCT/JP2010/065749

(51) Int. Cl.
C23C 14/00 (2006.01)
C25B 11/00 (2006.01)
(Continued)

(52) U.S. Cl.
CPC ............ *C23C 14/351* (2013.01); *C23C 14/35* (2013.01); *H01F 7/081* (2013.01); *H01J 25/50* (2013.01);
(Continued)

(58) Field of Classification Search
CPC .......................... H01J 37/3408; H01J 37/3452
(Continued)

(56) References Cited

U.S. PATENT DOCUMENTS 4,892,633 A * 1/1990 Welty .................. 204/192.12
5,262,028 A * 11/1993 Manley ................ 204/192.12
(Continued)

FOREIGN PATENT DOCUMENTS

JP 2003-514991 A 4/2003
JP 2005-8917 A 1/2005
(Continued)

OTHER PUBLICATIONS

International Search Report for PCT/JP2011/069597 dated Sep. 27, 2011.

*Primary Examiner* — Ibrahime A Abraham
(74) *Attorney, Agent, or Firm* — Kenealy Vaidya LLP

(57) ABSTRACT

A magnetic field generator arranged behind a target and for generating a magnetic field on a front surface of the target based on magnetic force lines can include a ring-shaped outer magnetic body having a pole axis in a parallel direction (X-direction) with respect to the target surface, a center magnetic body arranged on an inner side of the outer magnetic body and having a pole axis in a parallel direction (X-direction) with the direction of the pole axis of the outer magnetic body, a yoke plate for supporting the outer magnetic body and the center magnetic body from behind, and a magnetic permeable plate for changing a magnetic field distribution of the front surface of the target. The magnetic
(Continued)

permeable plate is arranged so as to be supported by the yoke plate from behind.

18 Claims, 15 Drawing Sheets

(51) Int. Cl.
 *C25B 13/00* (2006.01)
 *C23C 14/35* (2006.01)
 *H01J 37/34* (2006.01)
 *H01F 7/08* (2006.01)
 *H01J 25/50* (2006.01)

(52) U.S. Cl.
 CPC ...... *H01J 37/3405* (2013.01); *H01J 37/3452* (2013.01); *H01J 37/3461* (2013.01)

(58) Field of Classification Search
 USPC .................................................. 204/298.16
 See application file for complete search history.

(56) References Cited

U.S. PATENT DOCUMENTS

| | | | |
|---|---|---|---|
| 6,080,287 A | 6/2000 | Drewery et al. | |
| 6,258,217 B1 * | 7/2001 | Richards et al. | ........ 204/192.12 |
| 2009/0139853 A1 | 6/2009 | Yamamoto et al. | |

FOREIGN PATENT DOCUMENTS

| | | |
|---|---|---|
| JP | 2009-149973 A | 7/2009 |
| WO | 2004/108979 A1 | 12/2004 |
| WO | 2004/108980 A1 | 12/2004 |

* cited by examiner

[FIG. 1]
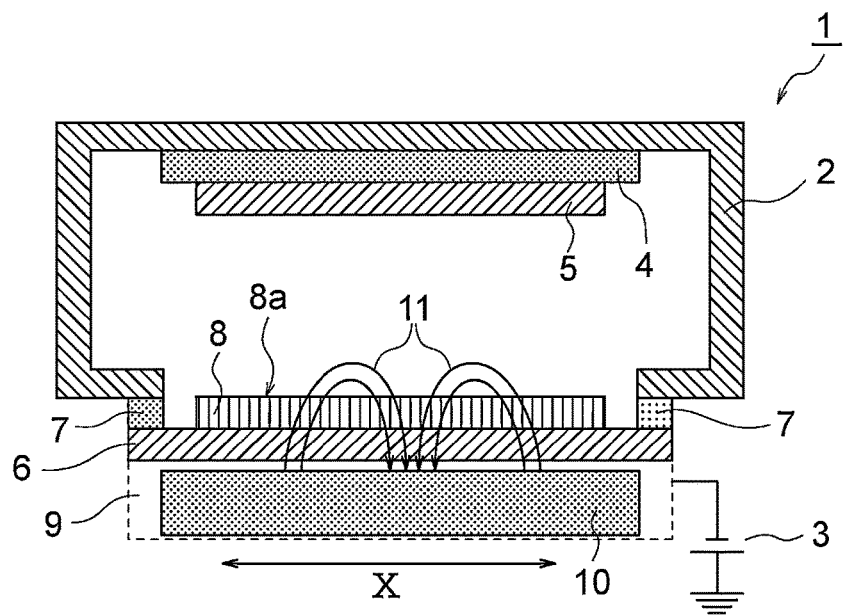

[FIG. 2A]
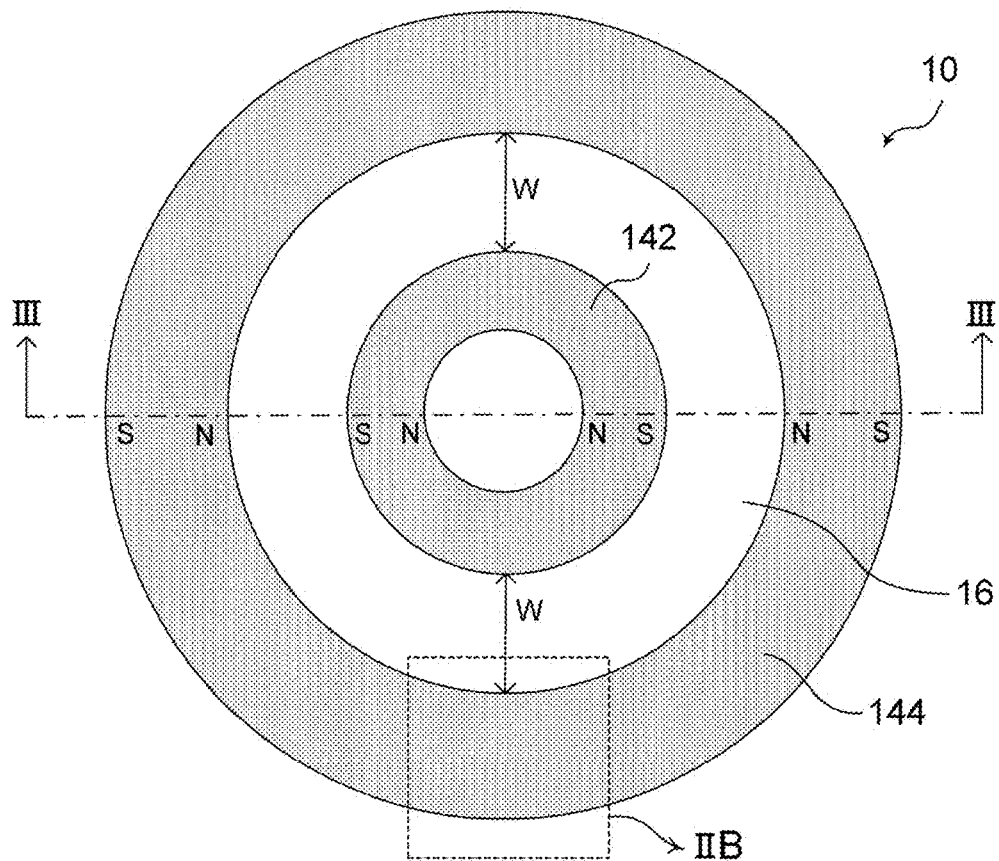
[FIG. 2B]
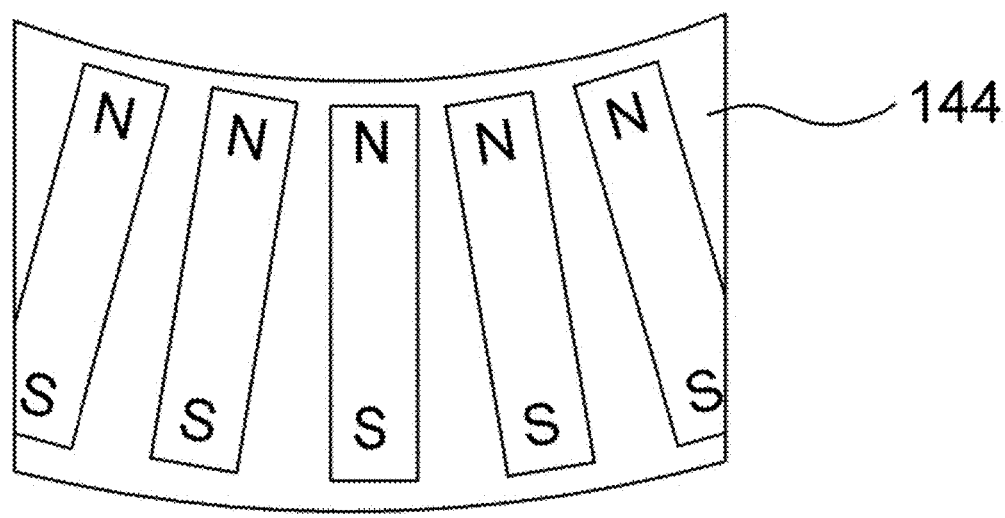

[FIG. 2C]
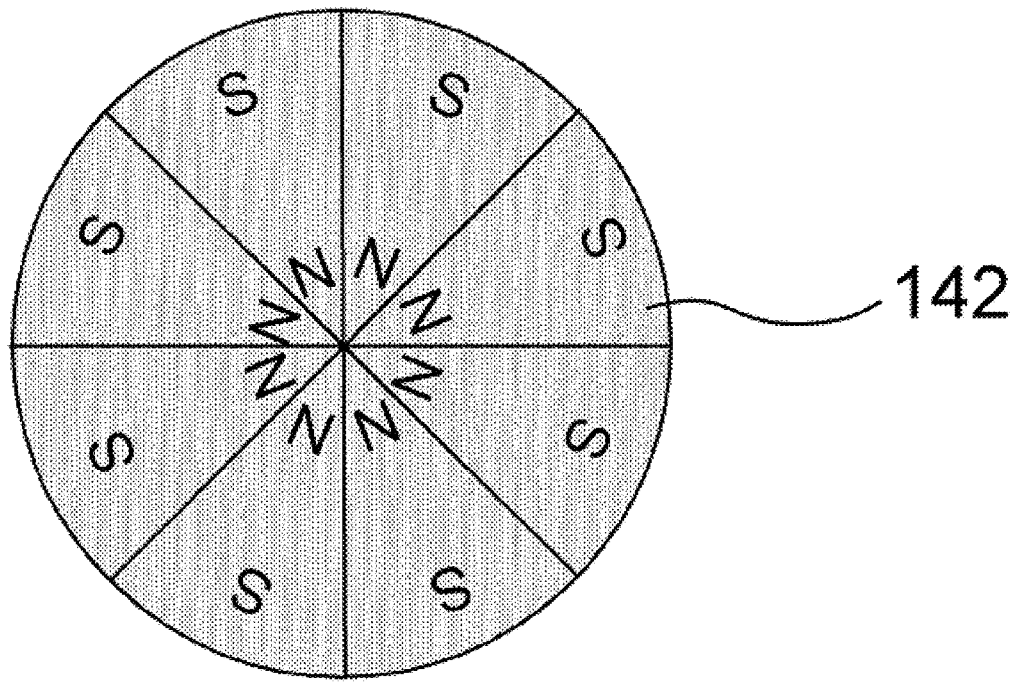
[FIG. 3]
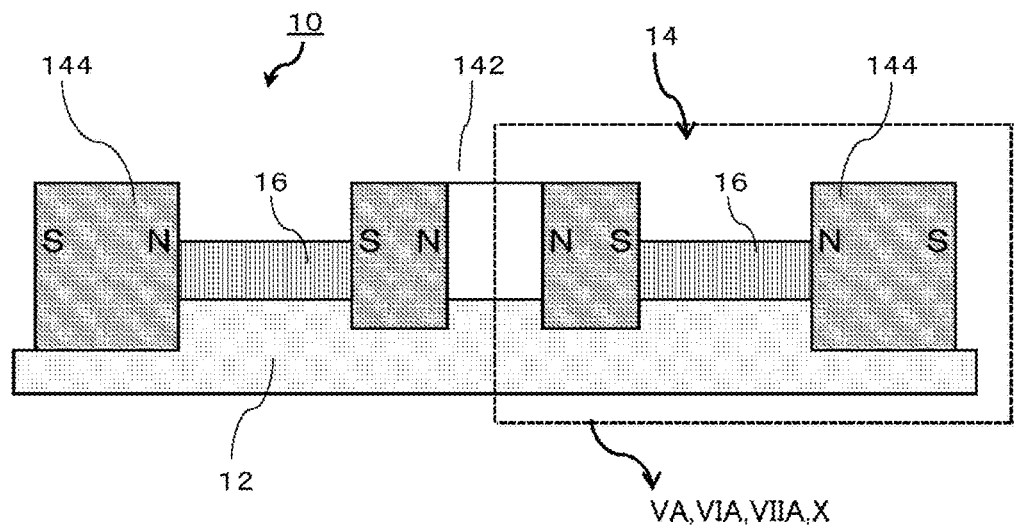

[FIG. 4A]
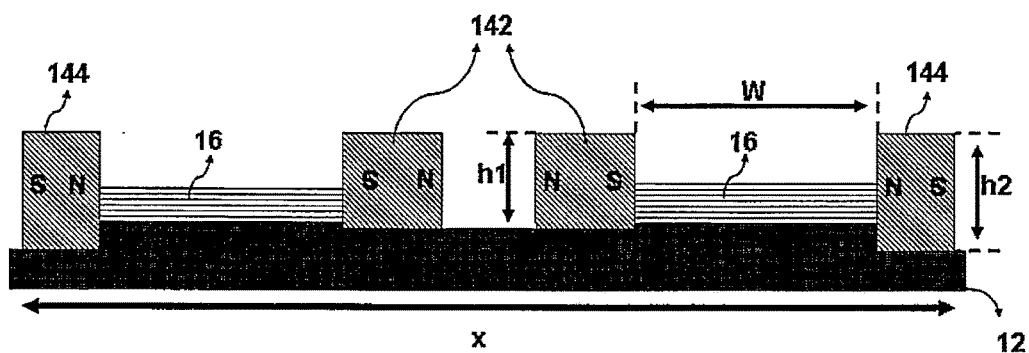
[FIG. 4B]
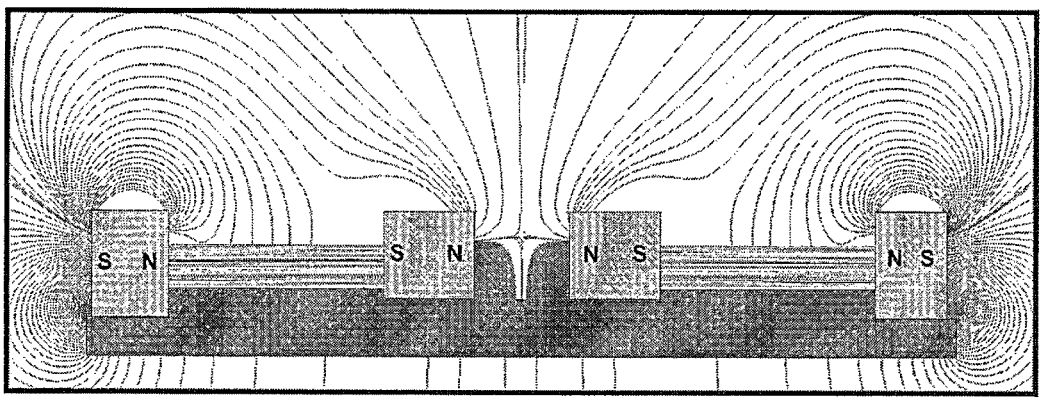

[FIG. 4C]
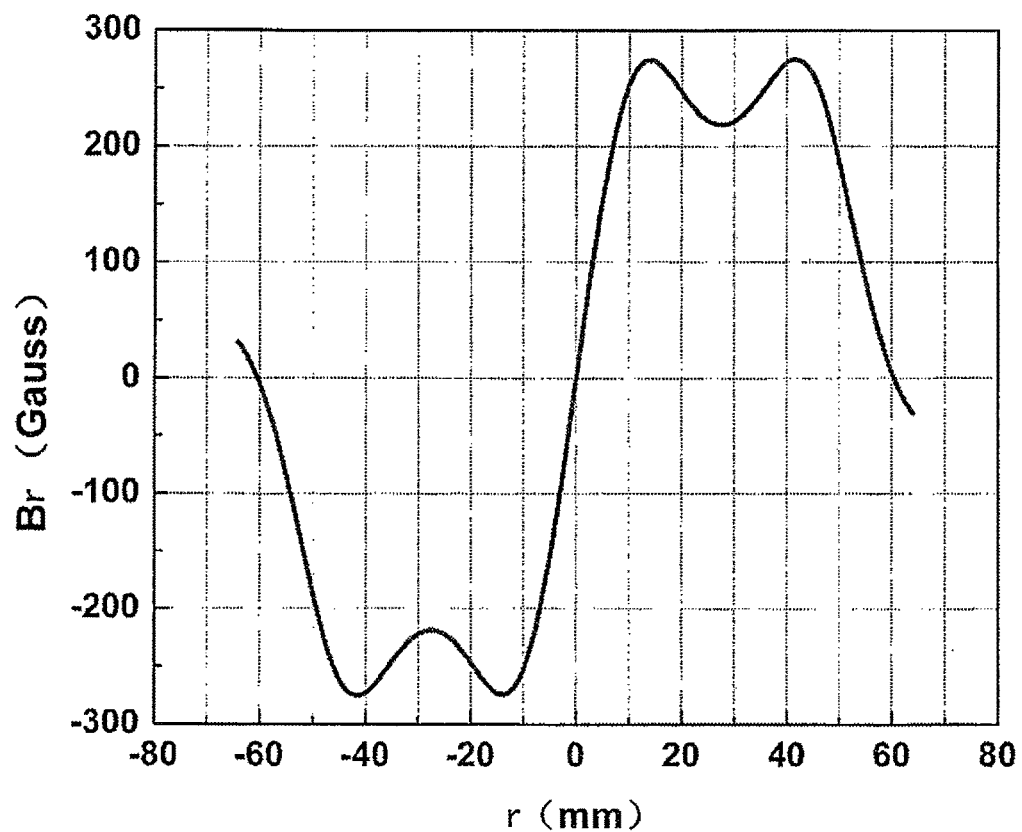

[FIG. 5A]
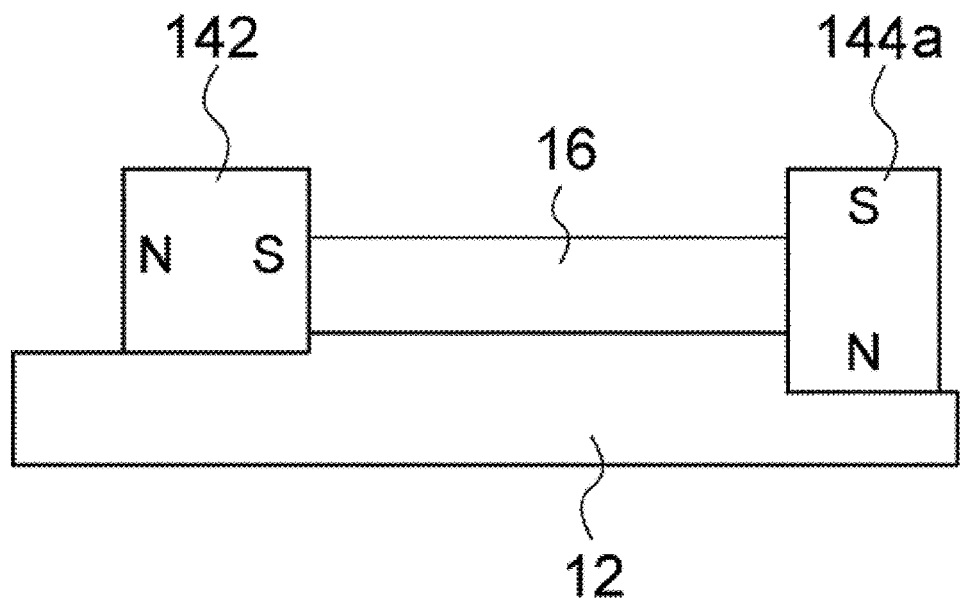
[FIG. 5B]
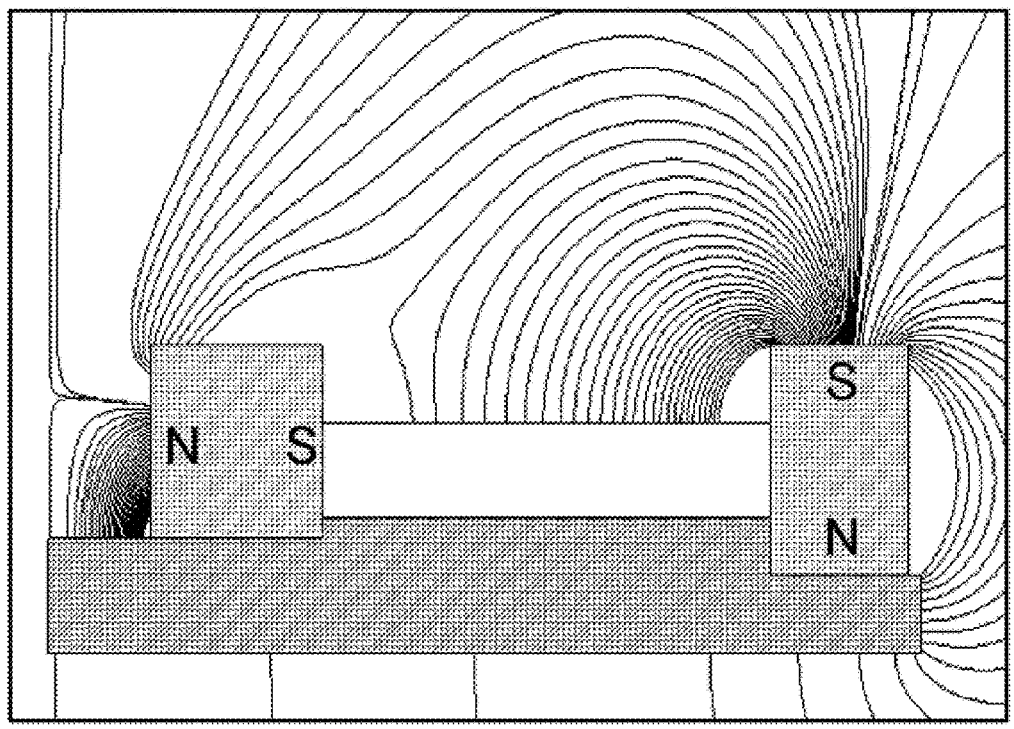

[FIG. 5C]
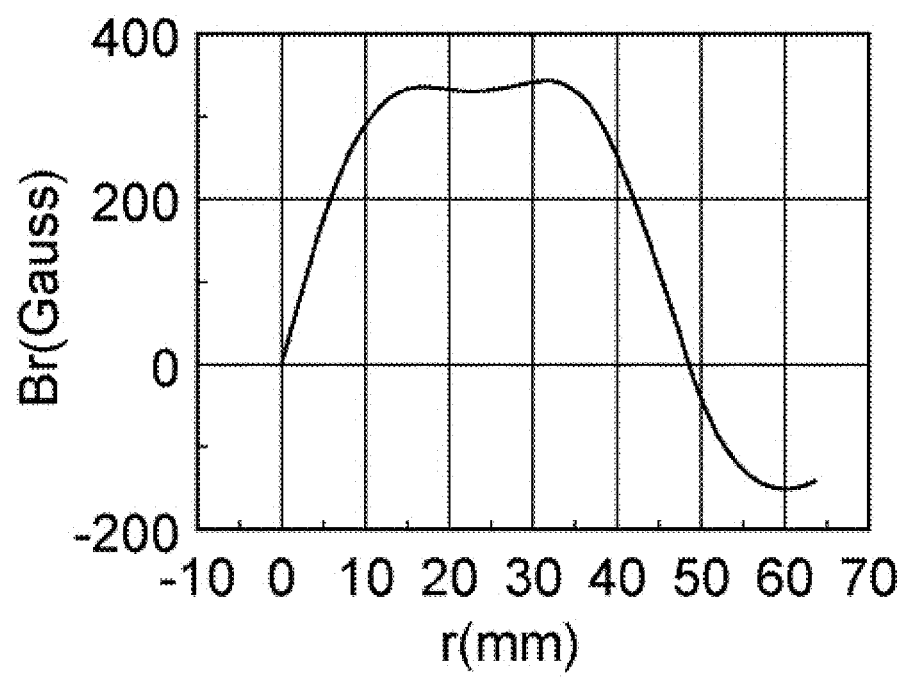

[FIG. 6A]
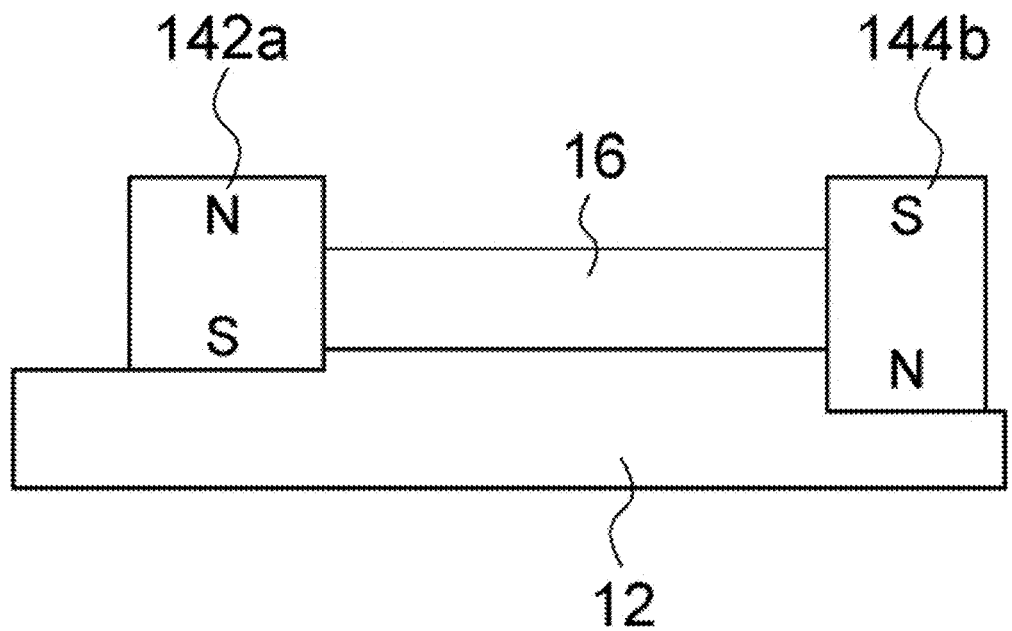
[FIG. 6B]
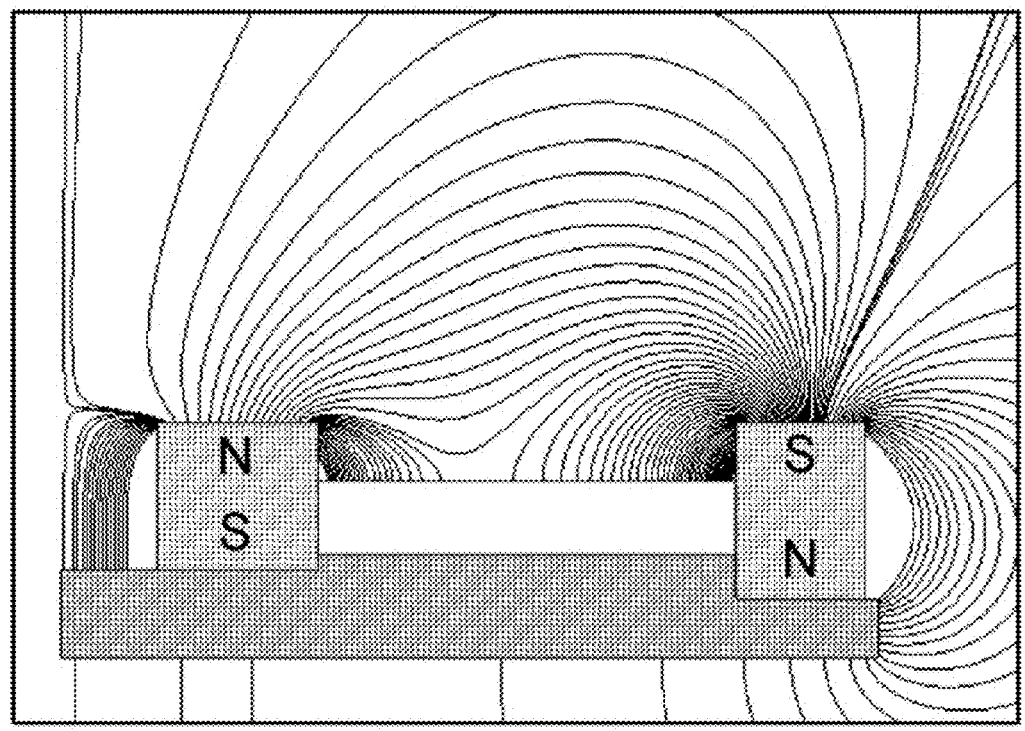

[FIG. 6C]
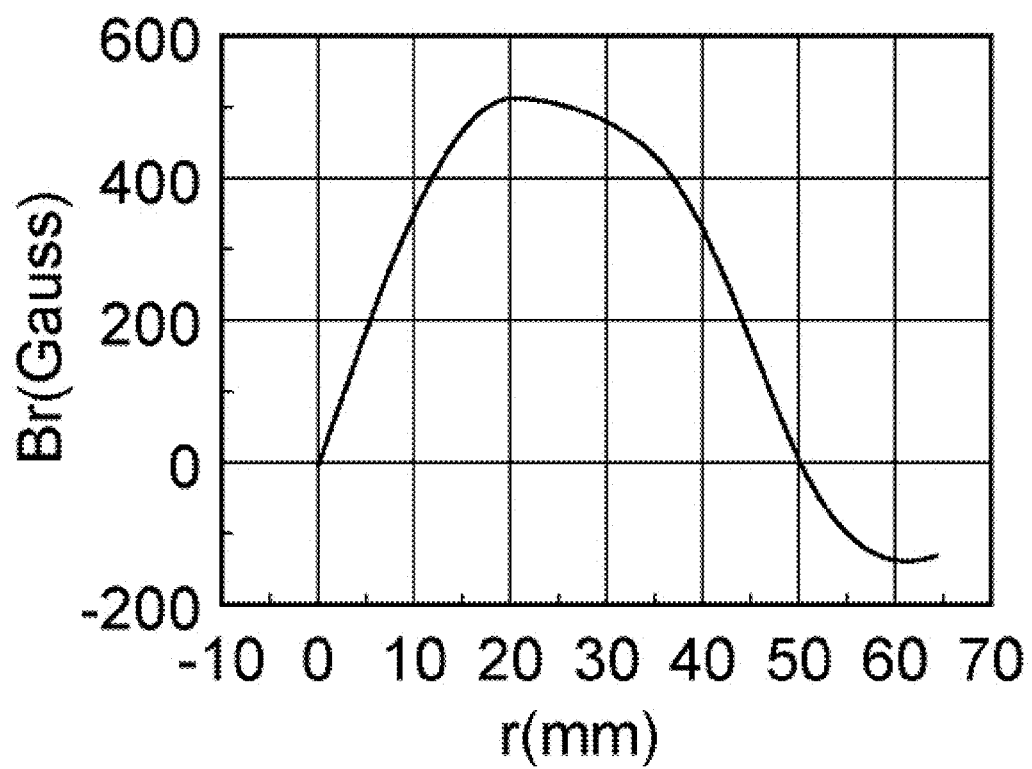

[FIG. 7A]
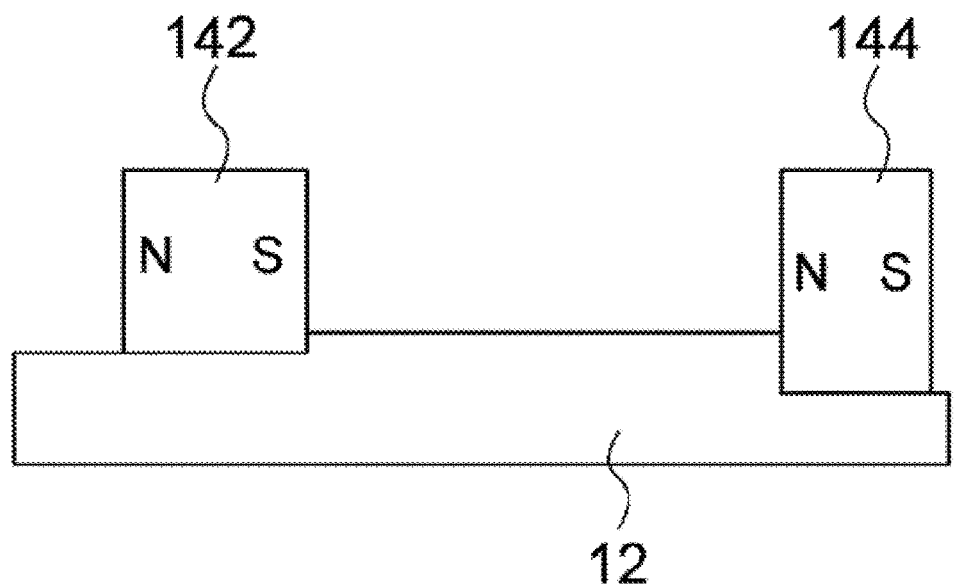
[FIG. 7B]
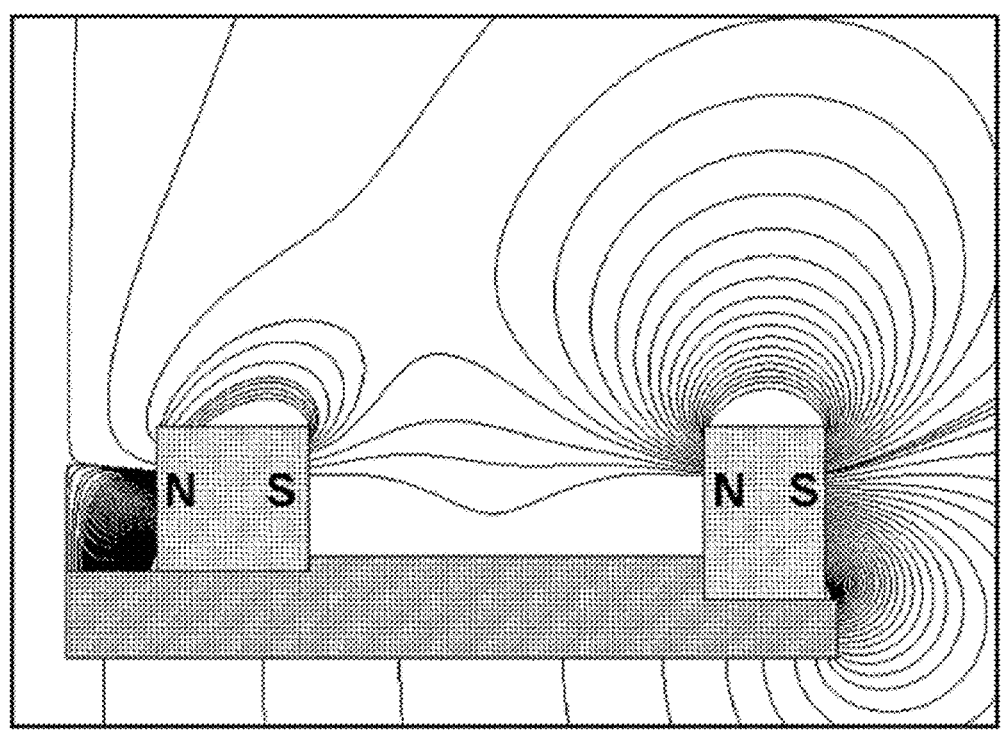

[FIG. 7C]
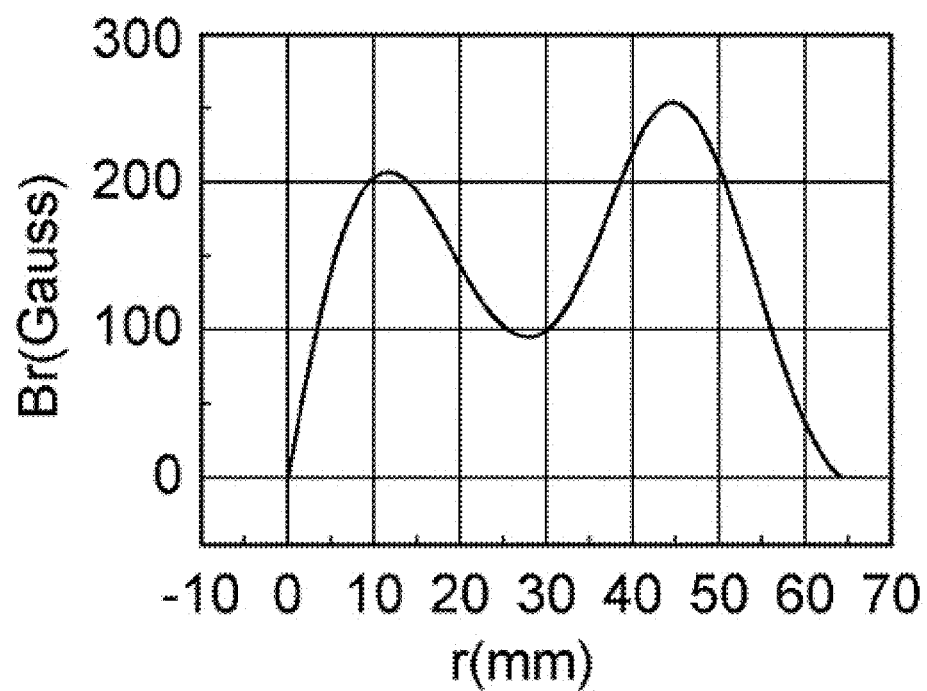

[FIG. 8]
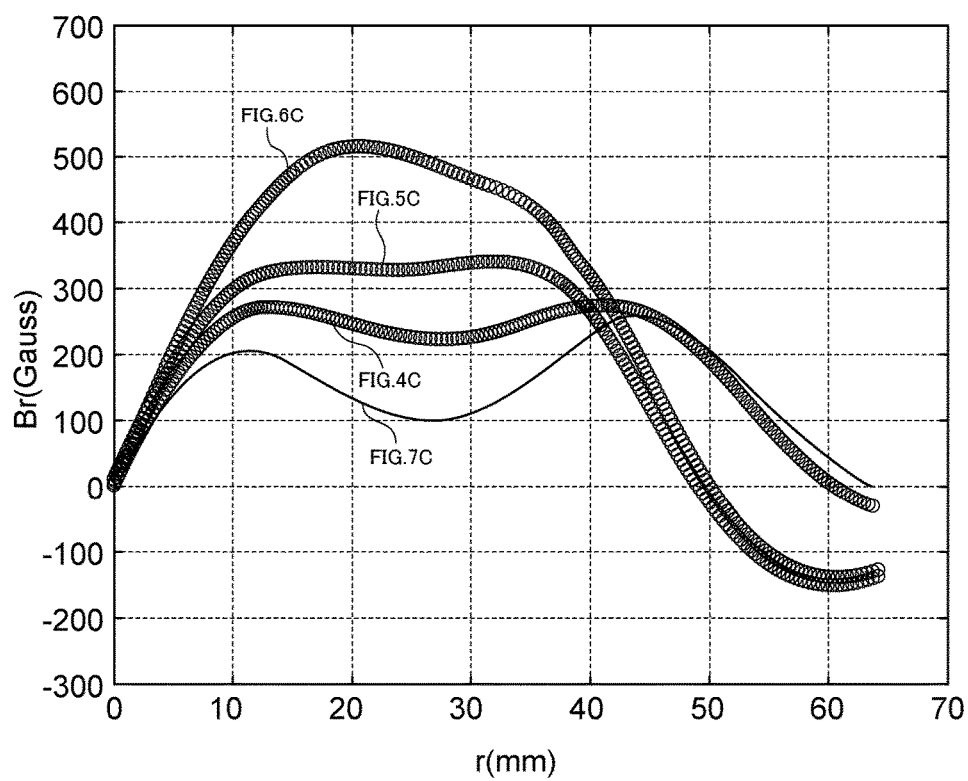

[FIG. 11]
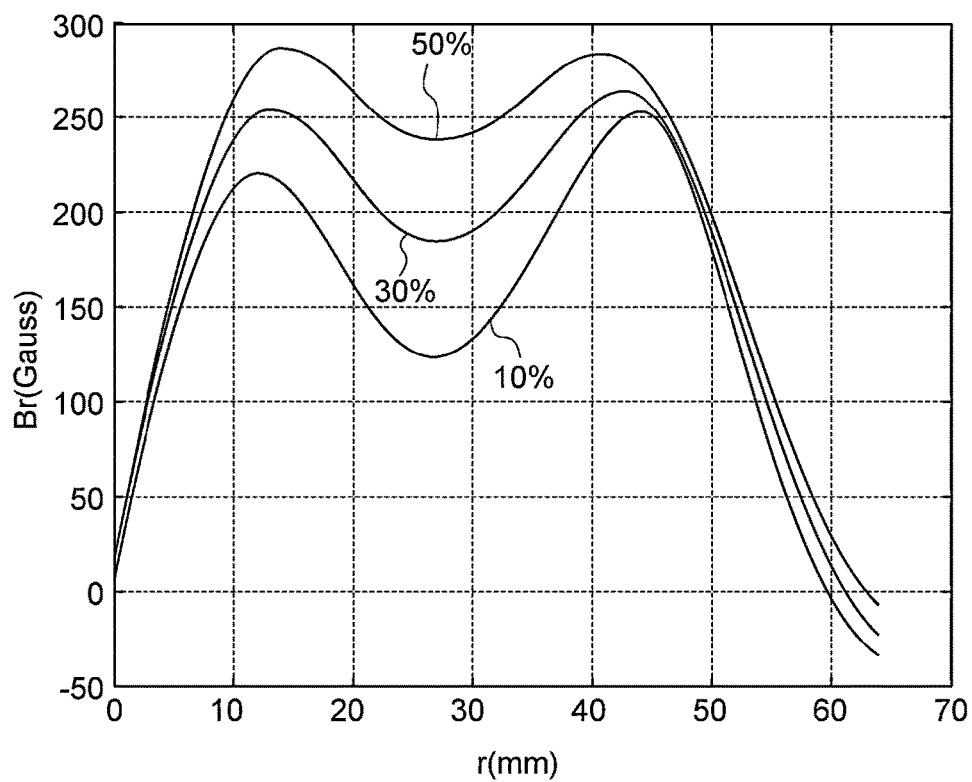

[FIG. 12]
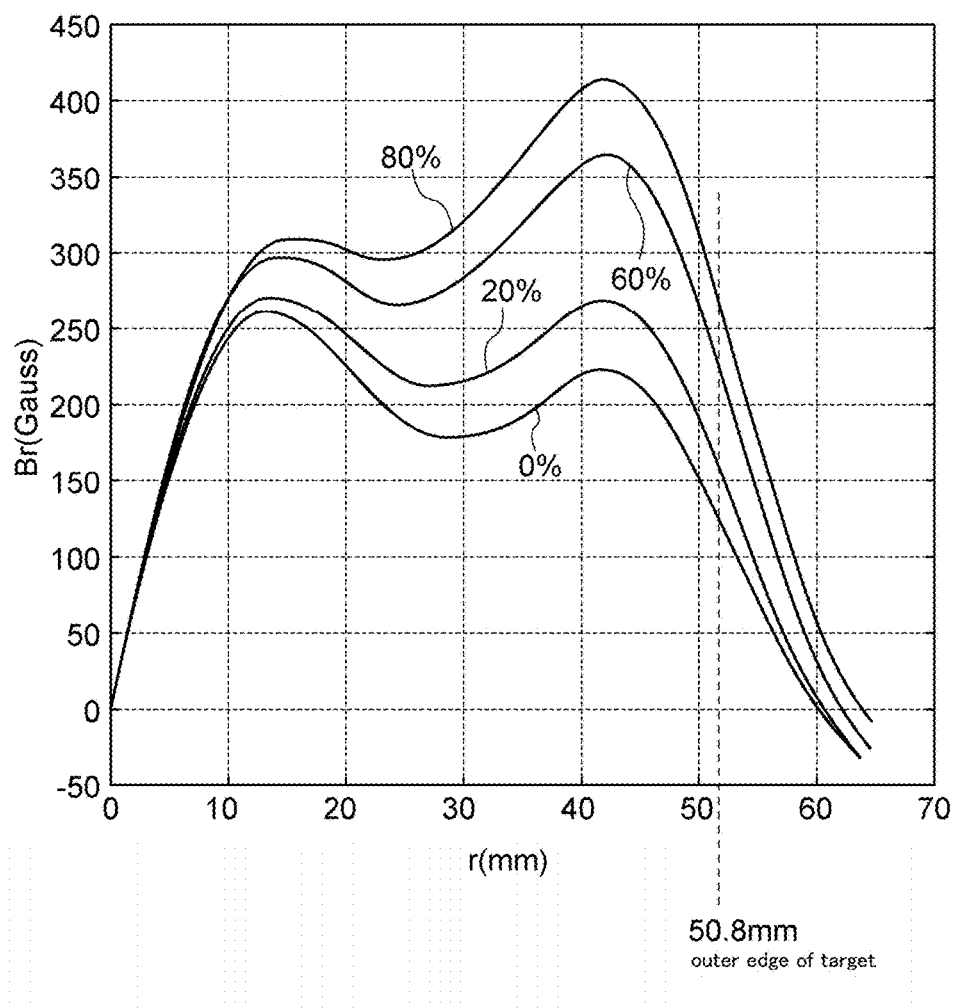

MAGNETIC FIELD GENERATOR, MAGNETRON CATHODE AND SPATTERING APPARATUS

This application is a U.S. national phase filing under 35 U.S.C. § 371 of PCT Application. No. PCT/JP2011/069597, filed Aug. 30, 2011, and is a continuation application claiming priority under 35 U.S.C. § 119 to PCT Application. No. PCT/JP2010/065749, filed Sep. 13, 2010, the entireties of both of which are incorporated herein by reference.

TECHNICAL FIELD

The presently disclosed subject matter relates to a magnet field generator, a magnetron cathode and a sputtering apparatus, and particularly relates to a sputtering technique which is suitably applied to a sputtering technique using a magnetron sputtering method by which plasma is confined close to a target due to a magnetic field (magnetron sputtering).

BACKGROUND ART

As a sputtering method, a magnetron sputtering is dominant wherein a magnetic field generator provided with a plurality of magnets is placed behind a target to be treated. The magnetron sputtering is a method of forming high density plasma by forming a magnetic field on a target surface by a magnet and confining plasma near the target surface by utilizing a drift motion of electrons. A high-speed film depositing becomes possible as a result that high-density plasma presents near the target surface.

There are a variety of proposals of a magnetic field generator to be placed behind a target (for example, the patent document 1).

RELATED ART DOCUMENTS

Patent Document

Patent Document 1: Published Japanese Translation of PCT International Publication for Patent Application (Kohyo) No. 2003-514991

SUMMARY OF THE DISCLOSED SUBJECT MATTER

A magnetic field generator used for magnetron sputtering, for example, disclosed in the patent document 1 is generally formed by arranging magnets on a plate-shaped yoke as a magnetic body. Here, outer magnets and inner magnets have opposite polarities and a magnetic field generated between the two polarities confines electrons to near a target surface. Consequently, on the target, an erosion-arising region (erosion region) is formed between the polarities. When the magnets are fixed with respect to the target, erosion reflecting a shape of the magnets appears on the target.

As explained above, when magnets are fixed with respect to the target and an erosion region appearing on the target is fixed, a target utilization rate (a ratio of an erosion volume with respect to a target volume) was extremely low in a magnetic field generator having a conventional configuration, which was uneconomical. Specifically, the target utilization rate was as low as 15 to 20% or so in the conventional configuration, which had been a problem when depositing a film by using an expensive target material. Therefore, an emergence of a technique for improving the target utilization rate has been desired.

An aspect of the presently disclosed subject matter is to provide a magnet field generator, a magnetron cathode and a supporting apparatus, with which a utilization rate of a target made by a substance for depositing a film, a thin film material, can be improved.

The presently disclosed subject matter attains the object above by the following solution. Note that, in the means for achieving the object below, an explanation will be made with numerical notations corresponding to those in drawings showing embodiments of the presently disclosed subject matter, however, the numerical notations are only to facilitate understanding of the invention and are not to limit the presently disclosed subject matter.

According to the presently disclosed subject matter, there is provided a magnetic field generator (10) arranged behind a target (8) and for generating a magnetic field on a front surface (8*a*) of the target (8) based on magnetic force lines (11), comprising:

a ring-shaped first magnetic body (144) having a pole axis in a parallel direction (X-direction) with respect to a surface of the target (8), a second magnetic body (142) arranged on an inner side of the first magnetic body (144) and having a pole axis in a parallel direction (X-direction) with the pole axis direction of the first magnetic body (144), a magnetic permeable base (12) supporting the first magnetic body (144) and the second magnetic body (142) from behind, and a magnetic field distribution change member (16) for changing a magnetic field distribution on a front surface (8*a*) of the target (8);

wherein the magnetic field distribution change member (16) is arranged to be supported by the base (12) from behind between the first magnetic body (144) and the second magnetic body (142).

In the magnetic field generator (10) configured as above, the second magnetic body (142) may be configured by a ring-shaped magnetic body. In this case, both of the first magnetic body (144) and the second magnetic body (142) are configured by a magnet component formed by arranging a plurality of small magnets in an array so that one magnetic pole directs an outer side and the other magnetic pole directs an inner side (refer to FIG. 2A and FIG. 2B). Note that the small magnet may be formed to have a pillar body, etc. having a bottom shape of square, triangle or sector.

In the magnetic field generator (10) configured as above, the magnetic field distribution change member (16) may have a height (h3) of 60% or less and 40% or more of a height (h1) of the first magnetic body (144). The magnetic field distribution change member (16) may be composed of a material having a magnetic permeability (μ2) of 50 or more.

According to the presently disclosed subject matter, there is provided a magnetron cathode having a magnetic field generator (10) arranged behind a target (8) for generating a magnetic field on a front surface (8*a*) of the target (8) based on magnetic force lines (11).

According to the presently disclosed subject matter, there is provided a sputtering apparatus (1) provided with the magnetron cathode configured as above.

According to the presently disclosed subject matter above, as a result that both of the first magnetic body and the second magnetic body are supported by the front surface of a magnetic permeable base so that the magnetic polarities are in the parallel direction (crosswise direction) with respect to a target surface, a width of an erosion region of magnetic force lines leaked on the front surface of the target can become wider. As a result, a utilization rate of an outer portion of the target is improved.

Also, when a magnetic field distribution changing member for changing a magnetic field distribution on the front surface of the target is arranged between the first magnetic body and the second magnetic body and on the front surface of the magnetic permeable base, a magnetic force line path is formed between the first magnetic body and the second magnetic body, thereby, a magnetic circuit generated between the first magnetic body and the second magnetic body is enhanced, consequently, magnetic field magnitude generated on the target can be increased. As a result, a utilization rate in the thickness direction of the target is improved.

Namely, according to the presently disclosed subject matter, a target utilization rate can be heightened.

BRIEF EXPLANATION OF THE DRAWINGS

FIG. 1 is a sectional diagram illustrating a sputtering apparatus provided with a magnetic field generator according to an embodiment of the present invention.

FIG. 2A is a plan view of the magnetic field generator as an embodiment used for the sputtering apparatus in FIG. 1 seen from the backing plate side, FIG. 2B is an enlarged view of a IIB portion in FIG. 2A (an embodiment of the present invention), and FIG. 2C is a plan view showing another example of a center magnetic body.

FIG. 3 is a sectional view along the line III-III in FIG. 2A.

FIG. 4A is a sectional view of FIG. 3 (an embodiment of the presently disclosed subject matter), FIG. 4B is a distribution map of magnetic force lines, and FIG. 4C is a graph showing a relationship of a position in the width direction (X-direction) of the target and a magnetic flux density.

FIG. 5A is a view corresponding to an enlarged view of the VA portion in FIG. 3 and showing a comparative example of the present invention, FIG. 5B is a distribution map of magnetic force lines, and FIG. 5C is a graph showing a relationship of a position in the width direction (X-direction) of the target and a magnetic flux density.

FIG. 6A is a view corresponding to an enlarged view of the VIA portion in FIG. 3 and showing a comparative example of the present invention, FIG. 6B is a distribution map of magnetic force lines, and FIG. 6C is a graph showing a relationship of a position in the width direction of the target and a magnetic flux density.

FIG. 7A is a view corresponding to an enlarged view of the VIIA portion in FIG. 3 and showing a comparative example of the present invention, FIG. 7B is a distribution map of magnetic force lines, and FIG. 7C is a graph showing a relationship of a position in the width direction of the target and a magnetic flux density.

FIG. 8 is a graph showing the respective curves in FIG. 4C, FIG. 5C, FIG. 6C and FIG. 7C in the same scale.

FIG. 11 is a graph showing a relationship of a position in the width direction of the target and a magnetic flux density when changing a value of a height of the magnetic permeable plate with respect to a height of the outer magnetic body.

FIG. 12 is a graph showing a relationship of a position in the width direction of the target and a magnetic flux density when changing a value of a level difference of respective base end portions of outer magnetic body and center magnetic body with respect to a height of outer magnetic body.

EXEMPLARY MODE FOR CARRYING OUT THE DISCLOSED SUBJECT MATTER

Figure 9:
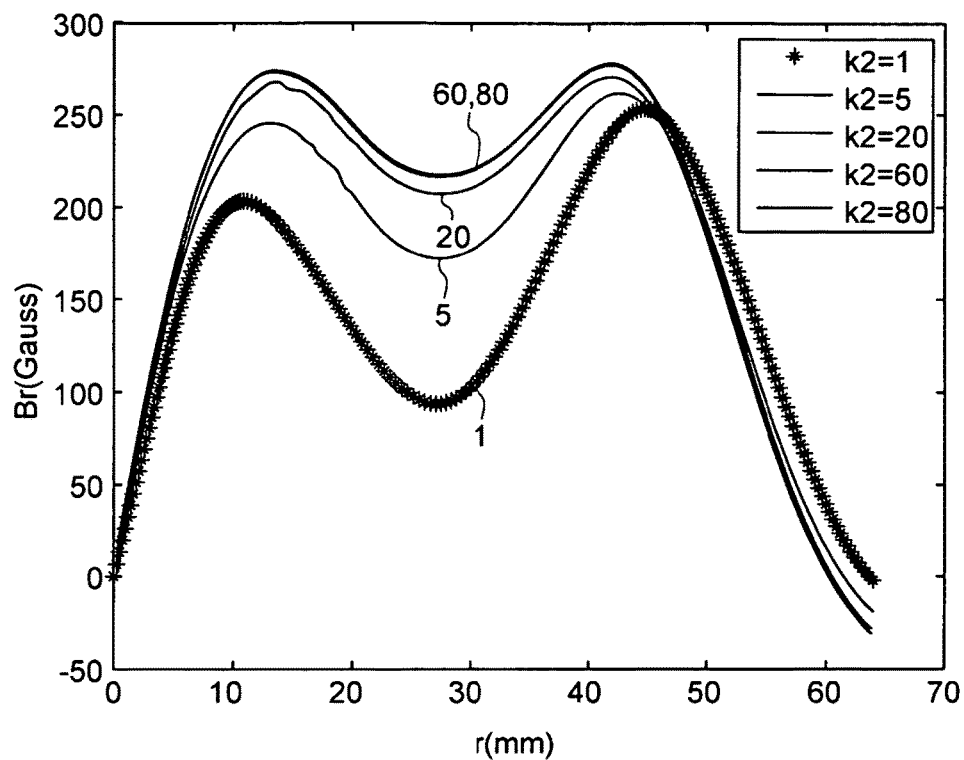
FIG. 9 is a graph showing a relationship of a position in the width direction of the target and a magnetic flux density when changing a magnetic permeability of a composing material of a magnetic permeable plate.

Below, an embodiment of the presently disclosed subject matter above will be explained based on the drawings.

<Sputtering Apparatus>

First, as an example of sputtering, a sputtering apparatus for performing magnetron sputtering will be explained.

As shown in FIG. 1, a sputtering apparatus 1 according to an embodiment of the presently disclosed subject matter has a vacuum chamber 2 and an inside thereof can be evacuated. On the upper portion of the vacuum chamber 2, a substrate holder 4 for holding a film deposition object (an object on which a film is deposited) 5 is provided facing downward. In film deposition by sputtering, for example, a glass substrate and a plastic substrate may be mentioned as the film deposition object 5 to be held by the substrate holder 4. Also, a pomp for evacuating and a gas inlet portion (both not shown), etc. are connected to the vacuum chamber 2.

In the present embodiment, the lower portion of the inner wall of the vacuum chamber 2 facing the substrate holder 4 is open, and a backing plate 6 is provided so as to close the opening. The backing plate 6 is connected to an outer wall of the vacuum chamber 2 via a cathode insulating member 7. When depositing a film by sputtering, the backing plate 6 is attached with a target 8 so that a front surface side thereof faces the film deposition object 5 held by the substrate holder 4. On the non-attachment surface (back surface) side, that is, the other side of the target 8 attachment surface (front surface) of the backing plate 6, an electrode portion 9 is provided.

<Electrode Portion>

The electrode portion 9 is a well-known one as a magnetron cathode and is provided outside of the vacuum chamber 2 and supplied with power from a power source 3. In the electrode portion 9, when depositing a film by sputtering, a magnetic field generator 10 for forming a magnetic field as shown by magnetic force lines 11 is provided near the front surface 8a on the film deposition object 5 side of the target 8.

<Magnetic Field Generator>

As shown in FIG. 2A and FIG. 3, the magnetic field generator 10 of the present embodiment has a yoke plate 12 as a base member, and a magnetic component 14 provided with a plurality of independent magnetic bodies is arranged on an upper surface of the yoke plate 12.

Note that when simply referring to "magnetic permeability" below, it means "magnetic permeability ($\mu$) of a material". Also, when referring to "relative magnetic permeability", it means "relative magnetic permeability (k) of a material". Relative magnetic permeability k is calculated as a ratio ($k=\mu/\mu 0$) of magnetic permeability $\mu$ of a material with respect to vacuum magnetic permeability ($\mu 0 = 4\pi \times 10^{-7}$).

The yoke plate 12 (base) of the present embodiment is preferably composed of a material having magnetic permeability ($\mu 1$) of, for example, 40 or higher, preferably 50 or higher and more preferably 60 or higher. The lower limit of the magnetic permeability $\mu 1$ of the material composing the yoke plate 12 is preferably 10. As such a material, for example, stainless steel and an alloy of Fe and Si may be considered. When composing the yoke plate 12 with a material having too low magnetic permeability μ1, the magnetic field on the front surface of the target 8 becomes susceptible to the effects of an outer magnetic field or an outer magnetic material, and the magnetic field to be generated on the front surface of the target 8 becomes unstable, which is not preferable. On the other hand, as a material of the yoke plate 12, when using a material having magnetic permeability μ1 of 40 or higher, preferably 50 or higher and more preferably 60 or higher, the disadvantage explained above is not caused.

An outer shape of the yoke plate 12 is an approximately same shape as that of the backing plate 6 when seeing visually from the backing plate 6 side (in a plane view). A thickness T1 (refer to FIG. 10) of the yoke plate 12 is, for example, 3 to 12 mm.

The magnetic component 14 of the present embodiment comprises a center magnetic body 142 (second magnetic bodies) and outer magnetic body (first magnetic bodies), and a magnetic permeable plate 16 is arranged between the center magnetic body 142 and the outer magnetic body 144. A structure of the center magnetic body 142 is not particularly limited and may be formed to be solid (for example, columnar shape and rectangular column shape) or hollow (for example, a ring form). In the present embodiment, the case where the center magnetic body 142 is made by a hollow small ring-shaped magnetic body will be explained as an example. The outer magnetic body 144 is made by a large ring-shaped magnetic body and arranged around the center magnetic body 142 leaving a space. The space W between the center magnetic body 142 and the outer magnetic body 144 may be decided to be 20 to 33% or so of a diameter of an electrode portion 9 when seeing the electrode portion 9 from the target 8 side as a planar view. When the space W is too narrow, a discharge region is liable to be too small, on the other hand, when W is too wide, it is liable that discharge becomes hard to rise. Note that, as to the "ring-shaped", the shape is not limited to a circular shape (a true circle and oval, etc.) and may naturally include polygonal shapes.

As shown in FIG. 2B, in the present embodiment, the case of configuring both of the magnetic bodies 142 and 144 by a magnetic component formed by arranging a plurality of small rectangular column (solid) magnets having a square-shaped bottom intermittently in an array so that one magnetic pole (for example, south pole) directs the outer side and the other magnetic pole (for example, north pole) directs the inner side is shown as an example. Note that the shape of the small magnets is not limited to a rectangular column shape and may be a triangular pillar having a triangle bottom, a pillar having a sector bottom and other pillar shapes.

When forming the center magnetic body 142 with a solid column or a solid rectangular column, for example, as shown in FIG. 2C, it can be configured by forming a plurality of small magnets having a sector-formed section, wherein its arc portion has one pole (for example, north pole), and continuously arranging them as shown in the figure.

Between the planes facing the target 8 of the center magnetic body 142 and the outer magnetic body 144 are connected by the magnetic force lines 11 (refer to FIG. 1). The magnetic force lines 11 connecting the center magnet body 142 and the outer magnet body 144 form a dome-shaped tunnel, wherein the center portion leaks on the front surface 8a of the target 8, a width is narrow at portions where the center magnetic body 142 and the outer magnetic body 144 are close and that at distant portions is wide.

Generally, a lower position (the lower positions of the top of the tunnel), where vertical components of the magnetic field are zero, is sputtered intensively. Namely, a target portion corresponding to the lower position of the top of the tunnel is deeply dug. This deeply-dug region is an erosion region. When magnets are fixed with respect to the target, the erosion appears on the target reflecting a shape of the magnets.

<Center Magnetic Body and Outer Magnetic Body>

As shown in FIG. 4A, in the present embodiment, both of the center magnetic body 142 and the outer magnetic body 144 are fixed on the upper surface of the yoke plate 12 so that poles (north pole and south pole) at both ends of the magnets are arranged in the parallel direction with the target 8 surface (for example, the width direction of the target 8 or in the X-direction). Here, the pole axis of the center magnetic body 142 directs from the inner side to the outside, and the center portion is hollow. Specifically, the center magnetic body 142 is in an order of the south pole, the north pole and hollow from the outside to the center portion and, then, hollow, the north pole and the south pole from the center portion to the opposite outside.

Namely, the center magnetic body 142 and the outer magnetic body 144 of the present embodiment are arranged on the yoke plate 12 so that their pole axes extend in the parallel direction with the surface of the target 8 (an embodiment of the present invention). Note that the "pole axis" means a line passing the north pole and the south pole as the magnetic poles at both ends of a magnet.

When configuring the center magnetic body 142 and the outer magnetic body 144 as such, a width of the erosion region of the magnetic force lines 11 leaking on the front surface 8a of the target 8 can be wider (refer to FIG. 4C, FIG. 5C and FIG. 6C) comparing with that in the case where at least any one of magnetic bodies 144a, 142a and 144b (refer to FIG. 5A and FIG. 6A as comparative examples of the present invention) in the both magnetic bodies are arranged so that magnetic poles thereof are in the perpendicular direction (the thickness direction of the target 8, or Z-direction) with respect to the target 8 surface (namely, when configured that the pole axis extents in the perpendicular direction with respect to the surface of the target 8).

Note that FIG. 4B, FIG. 5B and FIG. 6B show distributions of magnetic force lines leaking on the target when arranging magnets as shown in FIG. 4A, FIG. 5A and FIG. 6A, respectively. The distributions of magnetic force lines are detected by using general-purpose detection software (commodity name "COMSOL MULTI PHYSICS" made by COMSOLAB).

FIG. 4C, FIG. 5C and FIG. 6C are graphs of plotting by using value data obtained based on the respective magnetic force line distributions of FIG. 4B, FIG. 5B and FIG. 6B, wherein the axis of abscissa indicates a position in the width direction (X-direction) of the target surface and the axis of ordinate indicates a magnetic flux density Br on the front surface of the target.

In the present embodiment, a region where the magnetic flux density exceeds 100 gauss (Br>100 gauss) is assumed to be an erosion region, and the maximum value of a width position on the front surface of the target in this region was checked. The results were a bit less than 55 mm in FIG. 4C, a bit more than 45 mm in FIG. 5C and around 47 mm in FIG. 6C. Accordingly, the magnet arrangement in FIG. 4A exhibited the largest value of the width of the erosion region, and it is understood that the width of the erosion region became wider than those in the cases with other magnet arrangements.

In the present embodiment, a height h1 of the outer magnetic body 144 and a height h2 of the center magnetic body 142 are both designed to be, for example, 3.5 to 20% or so and preferably 6 to 12% or so of a diameter of the electrode portion 9 in a planar view of seeing the electrode portion 9 from the target 8 side as same as the case of a space W between the center magnetic body 142 and the outer magnetic body 144 explained above. In the present embodiment, the outer magnetic body 144 and the center magnetic body 142 may be formed so as to satisfy h1=h2, alternatively, the outer magnetic body 144 and the center magnetic body 142 may be formed as h1≠h2. In the present embodiment, it is preferable that the outer magnetic body 144 and the center magnetic body 142 are formed to satisfy h1<h2.

Note that the "height" used in the present embodiment means a height from the base end portion (the upper surface of the yoke plate 12) of the object (it is the same below).

<Magnetic Permeable Plate>

Going back to FIG. 4A. The magnetic permeable plate 16 arranged between the center magnetic body 142 and the outer magnetic body 144 is a member for increasing magnetic field magnitude of the erosion region on the front surface 8a of the target 8. The reason why the magnetic field magnitude of the erosion region is increased when providing a magnetic permeable plate 16 between the center magnetic body 142 and the outer magnetic body 144 is not all clear. According to a view of the inventors, a magnetic force line path is formed between the center magnetic body 142 and the outer magnetic body 144 first by providing it. As a result that a magnetic force line path is formed here, a magnetic circuit generated in the respective magnetic bodies of the center magnetic body 142 and the outer magnetic body 144 becomes weak. On the other hand, a magnetic circuit generated between the center magnetic body 142 and the outer magnetic body 144 is strengthened. As a result, comparing with a magnet structure of not forming a magnetic force line path between a center magnetic body and an outer magnetic body (refer, for example, to FIG. 7A), magnetic field magnitude arising on the target 8 can be greater (specifically, peak portions of a magnetic flux density curve become higher) (refer to FIG. 4C and FIG. 7C).

Note that FIG. 7B shows a distribution of magnetic force lines leaking on the target in the case of the magnet arrangement of FIG. 7A as same as in FIG. 4B, FIG. 5B and FIG. 6B above. FIG. 7C is a graph of plotting by using value data obtained based on the magnetic force line distribution in FIG. 7B, wherein the axis of abscissa indicates a position in the width direction (X-direction) of the front surface of the target and the axis of ordinate indicates a magnetic flux density Br on the front surface of the target.

In the present embodiment, the maximum width position of the front surface of the target in a region where the magnetic flux density exceeds 100 gauss (Br>100 gauss) was a bit less than 55 mm in FIG. 4C and a bit less than 57 mm in FIG. 7C, which were almost equal. On the other hand, values of magnetic flux density of the front surface of the target at respective positions of the target width of a bit more than 10 mm, a bit more than 25 mm and around 40 mm were checked. The results were 270 Gs, 220 Gs and 280 Gs, respectively, in FIG. 4C and 200 Gs, 100 Gs and 220 Gs in FIG. 7C. It is understood from the above that, in the case of providing the magnetic permeable plate 16 in FIG. 4A, magnetic field magnitude is increased comparing with that in the case of not providing it (the configuration in FIG. 7A).

Just for reference, FIG. 8 shows the respective curves in FIG. 4C, FIG. 5C, FIG. 6C and FIG. 7C together in the same scale.

Going back to FIG. 4A. The magnetic permeable plate 16 in the present embodiment is preferably composed of a material having a magnetic permeability (μ2) of, for example, 50 or higher, preferably 55 or higher and more preferably 60 or higher. The constituent material of the magnetic permeable plate 16 may be the same as the constituent material of the yoke plate 12 or may be a different material. As the material, for example, stainless steel, Ni, an alloy of Ni and Re and MnZnFeO may be mentioned. When the magnetic permeable plate 16 is composed of a material with a too low magnetic permeability μ2, there is no point in providing the magnetic permeable plate 16. When composing the magnetic permeable plate 16 with a material having a magnetic permeability μ2 of 50 or higher, a magnetic field on the front surface of the target 8 is not affected by a relative magnetic permeability (k2) of the magnetic permeable plate 16, and magnetic flux density becomes high at a center region between the center magnetic body 142 and the outer magnetic body 144 (a concave portion in the graph showing a relationship between a position in the width direction of the target and a magnetic flux density).

According to the graph shown in FIG. 9, it is understood that when the relative magnetic permeability k2 of the magnetic permeable plate 16 is 60 or lower (k2≤60), the minimum value and the maximum value of magnetic flux density gradually become large as the magnetic permeability b of the material composing the magnetic permeable plate 16 increases.

First, when the relative magnetic permeability k2 of the magnetic permeable plate 16 is 1 (k2=1), the effect of adopting the magnetic permeable plate 16 cannot be observed. Specifically, most of the magnetic force lines 11 coming out from the north pole of the center magnetic body 142 enter the south pole of the center magnetic body 142. Therefore, most of the magnetic force lines 11 coming out from the north pole of the outer magnetic body 144 enter the south pole of the outer magnetic body 144. This causes a decline of a magnetic flux density at the center region between the center magnetic body 142 and the outer magnetic body 144 (The concave part in the drawing. It is the same below.).

Next, when the relative magnetic permeability k2 of the magnetic permeable plate 16 exceeds 1 (k2>1), the effect of adopting the magnetic permeable plate 16 can be observed. Specifically, a part of the magnetic force lines 11 coming out from the north pole of the center magnetic body 142 follows inside the magnetic permeable plate 16 to enter the south pole of the outer magnetic body 144, comes out from the north pole of the outer magnetic body 144 and, then, passes above the outer magnetic body 144 to enter the south pole of the center magnetic body 142. Such a mechanism heightens the magnetic flux density at the center region between the center magnetic body 142 and the outer magnetic body 144.

On the other hand, when the relative magnetic permeability k2 of the magnetic permeable plate 16 exceeds 60 (k2>60), even if the magnetic permeability μ2 of the magnetic permeable plate 16 increases, a rise of the magnetic flux density along therewith is not observed and a rise of the magnetic density has peaked at the time the relative magnetic permeability k2 becomes 60 in this experimental example.

Figure 10:
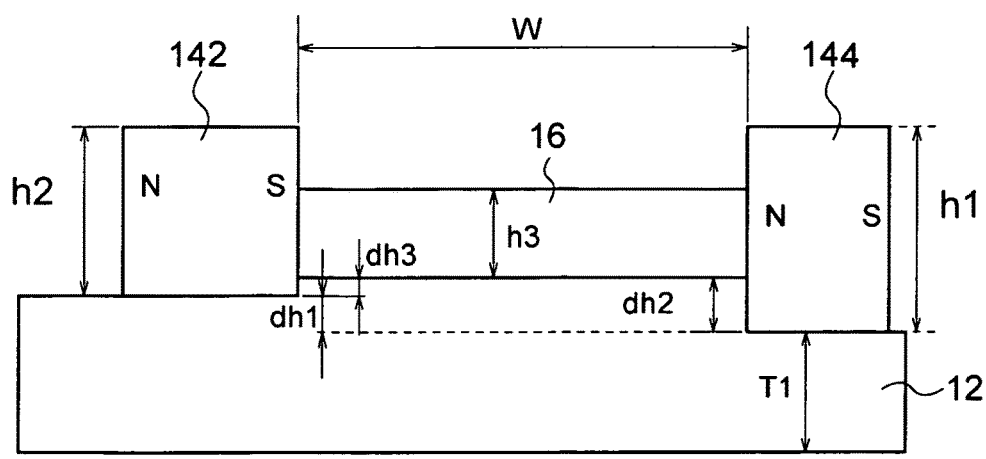
FIG. 10 is an enlarged view of the X portion in FIG. 3.

As shown in FIG. 10, a height h3 of the magnetic permeable plate 16 is preferably 60% or less of the height h1 of the outer magnetic body 144 (h3≤(0.6·h1)). When h3 exceeds 60% of h1, the effect of increasing magnetic field magnitude in the erosion region arising on the front surface 8a of the target 8 declines, which results in wasting a material of the magnetic permeable plate, which is not economical. On the other hand, when h3 is too low with respect to h1, there is no point in providing the magnetic permeable plate 16 from the beginning. Therefore, the lower limit of the height h3 of the magnetic permeable plate 16 is preferably 40% or so of h1 (that is, (0.4·h1)≤h3).

It is understood according to the graph shown in FIG. 11 that, by changing h3 to be 10%, 30% and 50% of h1 in the configuration shown in FIG. 10, a shape of the magnetic force line 11 leaking on the front surface of the target 8 changes and, thereby, the way the front surface of the target 8 is dug changes. In the graph in FIG. 11, it is understood that the case of 50% is better. Namely, in the case of 50%, the shape of the magnetic force line 11 has more even heights at the peaks, which means it becomes possible to dig the target 8 uniformly comparing with other cases.

As explained above, in the present embodiment, by changing one or both of the magnetic permeability μ2 of a material and the height h3 of the magnetic permeable plate 16, it becomes possible to attain a proper shape of the magnetic force lines 11, particularly, to adjust a magnetic flux density value (change of the degree of concave) of the center region (the concave region) between the outer magnetic body 144 and the center magnetic body 142. Accordingly, with a relatively simple design modification, such as changes of the magnetic permeability μ2 of a material and the height h3 of the magnetic permeable plate 16, a proper shape of the magnetic force lines 11 can be obtained without bothering to change a size and arrangement of magnets.

Going back to FIG. 10. In the present embodiment, respective base end portions of the outer magnetic body 144 and the center magnetic body 142 may have a different level (which is dh1 being equal to dh2−dh3 and will be explained later on). Namely, the center magnetic body 142 and the outer magnetic body 144 may be arranged so that levels at the respective base end portions of the outer magnetic body 144 and the center magnetic body 142 become different in the thickness direction. Thereby, in combination with a provision of the magnetic permeable plate 16, a concave and convex shape of the magnetic force lines 11 arising near the front surface of the target 8 can be optimized. Specifically, the concave bottom of the curved shape of the magnetic force lines 11 can be pulled up toward the convex side to contribute to forming of an even magnetic field.

In the present embodiment, the level difference dh1 may be 10% or more of the height h11 of the outer magnetic body 144 and preferably 10 to 30% or so.

It is understood according to the graph shown in FIG. 12 that, in the configuration shown in FIG. 10, by changing dh1 to 0%, 20%, 60% and 80%, a shape of the magnetic force line 11 leaked on the front surface of the target 8 changes and the way the front surface of the target 8 is dug changes thereby. In the graph in FIG. 12, it is understood that the case with 20% is better. Namely, in the case of 20%, the shape of the magnetic force line 11 has more even heights at the peaks, which means it becomes possible to dig the target 8 uniformly.

Going back to FIG. 10. In the present embodiment, base end portions of the center magnetic body 142 and the magnetic permeable plate 16 and those of the outer magnetic body 144 and the magnetic permeable plate 16 may also have different levels, respectively. As a result of providing a level difference (dh2) at the base end portions of the center magnetic body 142 and the magnetic permeable plate 16, a digging depth of a whole region to be dug on the front surface of the target 8 can be uniform. As a result of providing a level difference (dh3) at the base end portions of the outer magnetic body 144 and the magnetic permeable plate 16, the same effects as in the case of providing the level difference (dh2) explained above can be obtained. The level difference dh2 and the level difference dh3 may be, for example, 2 to 8 mm.

<Sputtering Film Deposition Method>

Next, with reference to FIG. 1 to FIG. 3, an explanation will be made on an example of a film deposition procedure by a sputtering apparatus 1 provided with the magnetic field generator 10 explained above.

After evacuating inside the vacuum chamber 2 of the sputtering apparatus 1, a film deposition object 5 is conveyed into the chamber 2 and held by the substrate holder 4 so as to face to the target 8 placed on the backing plate 6. As the target 8, a metal target, such as Al, Si and Nb, is used. A sputtering gas is introduced to the chamber 2, and inside the chamber 2 is kept to be a predetermined pressure. The sputtering gas is, for example, an Ar gas. Note that reactive sputtering may be performed by adding a reactive gas (oxygen gas, etc.) to the sputtering gas.

When power (DC power) is supplied from the power source 3 to the target 8 on the backing plate 6 via an electrode portion 9, discharge arises inside the chamber 2, the target 8 is sputtered and, for example, an Al film is deposited on the film deposition object 5.

After depositing a film for a predetermined time, the supply of the power and the sputtering gas is stopped and inside the chamber 2 is evacuated, then, the film deposition object 5 after finished with film deposition is taken out from the chamber 2.

In the present embodiment, during the sputtering film deposition, when activating the magnetic field generator 10 of the electrode portion 9, magnetic force lines 11 having a predetermined shape arise near the front surface on the film deposition object 5 side of the target 8. A high density plasma is generated between the target 8 and the film deposition object 5 by a magnetic field near the front surface of the target 8 based on the magnetic field by the generated magnetic force lines 11 and the power supplied from the power source 3, and the target 8 is sputtered. When sputtering particles reach a surface of the film deposition object 5, a thin film is grown on the surface.

<Function Effects>

In the present embodiment, the electrode portion 9 is arranged on the back side of the backing plate 6, which is provided inside the vacuum chamber 2, and the electrode portion 9 includes the magnetic field generator 10 having a specific configuration. In the magnetic field generator 10, a magnetic component 14 provided with a plurality of independent magnetic bodies is arranged on an upper surface of the yoke plate 12 as a base member. The magnetic component 14 includes the center magnetic body 142 and the outer magnetic body 144 fixed on the upper surface of the yoke plate 12 so that magnetic poles at both ends of the magnets are arranged in the parallel direction (X-direction) with the target 8 surface. Between the center magnetic body 142 and the outer magnetic body 144 is arranged a magnetic permeable plate 16. The specific magnetic component 14 configured and arranged as such is provided.

The center magnetic body 142 and the outer magnetic body 144 are fixed on the upper surface of the yoke plate 12 so that the magnetic poles are arranged at both ends in the parallel direction with respect to the target 8 surface, consequently, a width of an erosion region of magnetic force lines 11 leaking on the front surface 8*a* of the target 8 can become wider comparing with that in the case where magnetic poles of at least either one of the magnetic bodies are arranged in the perpendicular direction (Z-direction) with respect to the target 8 surface. Due to this, the utilization rate of the outer portion of the target 8 improves. Specifically, the utilization rate at the outer portion rises by 3 to 5%.

By providing the magnetic permeable plate 16 between the center magnetic body 142 and the outer magnetic body 144, a magnetic force line path is formed between the center magnetic body 142 and the outer magnetic body 144 first and, by forming the magnetic force line path here, a magnetic circuit generated between the center magnetic body 142 and the outer magnetic body 144 is strengthen. As a result, magnetic field magnitude arising on the target 8 increases comparing with that in a magnetic component of not forming any magnetic force line path between the center magnetic body and the outer magnetic body. Due to this, the utilization rate in the thickness direction of the target 8 improves. Specifically, the utilization rate in the thickness direction rises by 10 to 15% or so.

Namely, according to the present embodiment, the target utilization rate as a whole can be increased from 30% to about 40% or more.

Other Embodiments

The embodiments explained above are described to facilitate understanding of the present invention and are not to limit the invention. Accordingly, respective elements disclosed in the above embodiments include all design modifications and equivalents belonging to the technical scope of the present invention.

The sputtering apparatus is not limited to the above configuration and a carousel type sputtering apparatus described, for example, in the international publication No. 2004/108979 and 2004/108980 may be applied, as well. The carousel type sputtering apparatus has a cylindrical substrate holder arranged in a rotatable way in a vacuum chamber, a target and electrode portion (sputtering sources) and a plasma source at one or more positions around the substrate holder, and by repeatedly performing a sputtering treatment and plasma treatment on a substrate as a film deposition object held on the outer circumferential surface of the substrate holder while rotating the substrate holder, depositing a plurality of single layer thin films having a desired film thickness on the substrate so as to be able to form a multilayer film.

In this case, the sputtering source for performing the sputtering treatment may be configured to be a dual-cathode type provided with two magnetron sputtering electrodes. A metal target is held on a surface on one end side of each electrode, and the magnetic field generator 10 of the present embodiment is arranged at the other end side. Note that on the other end side of each electrode, other than the magnetic field generator 10, an alternating-current power source may be connected as a power supply means via a transformer as a power control means so as to configure to apply an alternating-current voltage to the respective electrodes.

When the substrate holder rotates once around the center axis, one sputtering treatment and plasma treatment is performed and, thereby, a super thin film having an average film thickness of 0.01 nm to 1.5 nm or so is formed on the substrate. By repeating this treatment for every rotation of the substrate holder, a next super thin film is deposited on the super thin film, so that a single-layer thin film having a desired film thickness of some nm to hundreds nm or so is formed on the substrate. A multilayer film is formed by stacking a plurality of the single-layer thin films. The present invention is also effective when applied to a carousel type magnetron sputtering apparatus like this.

DESCRIPTION OF NUMERICAL NOTATIONS

1 . . . sputtering apparatus, 2 . . . vacuum chamber (vacuum tank), 3 . . . power source, 4 . . . substrate holder, 5 . . . film deposition object, 6 . . . backing plate, 7 . . . cathode insulating member, 8 . . . target, 9 . . . electrode portion (magnetron cathode), 10 . . . magnetic field generator, 11 . . . magnetic force line, 12 . . . yoke plate (base), 14 . . . magnetic component, 142 . . . center magnetic body (second magnetic body), 144 . . . outer magnetic body (first magnetic body), 16 . . . magnetic permeable plate (magnetic field distribution change member)

The invention claimed is:

1. A magnetic field generator arranged behind a target and for generating a magnetic field on a front surface of the target based on magnetic force lines, comprising:
    a ring-shaped first magnetic body having a pole axis in a parallel direction with respect to a surface of the target,
    a ring-shaped second magnetic body arranged on an inner side of the first magnetic body and having a pole axis in a parallel direction with the pole axis direction of the first magnetic body,
    a magnetic permeable base supporting the first magnetic body and the second magnetic body from behind, and
    a magnetic field distribution change member for changing a magnetic field distribution on a front surface of the target;
    wherein the magnetic field distribution change member has (i) a width corresponding to a distance between the first magnetic body and the second magnetic body and (ii) a height perpendicular to the width and being uniform along the entire distance between the first magnetic body and the second magnetic body, and is arranged to be supported directly by the base from behind the first magnetic body and the second magnetic body,
    wherein the first magnetic body, the second magnetic body and the magnetic field distribution change member are supported at different levels on the base while an upper surface of the magnetic field distribution change member is disposed at a level different from both upper surfaces of the first and second magnetic bodies.

2. The magnetic field generator according to claim 1, wherein both of the first magnetic body and the second magnetic body are configured by a magnet component formed by arranging a plurality of small magnets in an array so that one magnetic pole directs an outer side and the other magnetic pole directs an inner side.

3. The magnetic field generator according to claim 2, wherein each of the plurality of small magnets has a pillar shape having a bottom shape of square, triangle or sector.

4. The magnetic field generator according to claim 1, wherein the magnetic field distribution change member has a height of 40 to 60% of a height of the first magnetic body.

5. The magnetic field generator according to claim 1, wherein the magnetic field distribution change member is composed of a material having a magnetic permeability of 50 or more.

6. The magnetic field generator according to claim 2, wherein the magnetic field distribution change member has a height of 40 to 60% of a height of the first magnetic body.

7. The magnetic field generator according to claim 3, wherein the magnetic field distribution change member has a height of 40 to 60% of a height of the first magnetic body.

8. The magnetic field generator according to claim 2, wherein the magnetic field distribution change member is composed of a material having a magnetic permeability of 50 or more.

9. The magnetic field generator according to claim 3, wherein the magnetic field distribution change member is composed of a material having a magnetic permeability of 50 or more.

10. The magnetic field generator according to claim 4, wherein the magnetic field distribution change member is composed of a material having a magnetic permeability of 50 or more.

11. The magnetic field generator according to claim 1, wherein the level difference between the base end portions of the first and second magnetic bodies is 10 to 30% of the height of the first magnetic body.

12. The magnetic field generator according to claim 1, wherein the base and magnetic field distribution change member are each made from a different material.

13. The magnetic field generator according to claim 1, wherein the base and magnetic field distribution change member are each made from a material selected from the group of (i) stainless steel, (ii) nickel, (iii) an alloy of nickel and rhenium, (iv) MnZnFeO and (v) an alloy of iron and silicon.

14. The magnetic field generator according to claim 1, wherein a height of the first magnetic body is greater than a height of the second magnetic body.

15. A magnetron cathode having a magnetic field generator arranged behind a target for generating a magnetic field on a front surface of the target based on magnetic force lines, wherein
the magnetic field generator comprises
a ring-shaped first magnetic body having a pole axis in a parallel direction with respect to a surface of the target,
a ring-shaped second magnetic body arranged on an inner side of the first magnetic body and having a pole axis in a parallel direction with the pole axis direction of the first magnetic body,
a magnetic permeable base supporting the first magnetic body and the second magnetic body from behind, and
a magnetic field distribution change member for changing a magnetic field distribution on a front surface of the target;
wherein the magnetic field distribution change member has (i) a width corresponding to a distance between the first magnetic body and the second magnetic body and (ii) a height perpendicular to the width and being uniform along the entire distance between the first magnetic body and the second magnetic body, and is arranged to be supported directly by the base from behind the first magnetic body and the second magnetic body,
wherein the first magnetic body, the second magnetic body and the magnetic field distribution change member are supported at different levels on the base while an upper surface of the magnetic field distribution change member is disposed at a level different from both upper surfaces of the first and second magnetic bodies.

16. The magnetron cathode according to claim 15, wherein the level difference between the base end portions of the first and second magnetic bodies is 10 to 30% of the height of the first magnetic body.

17. A sputtering apparatus provided with a magnetron cathode, wherein
the magnetron cathode has a magnetic field generator arranged behind a target for generating a magnetic field on a front surface of the target based on magnetic force lines, and
the magnetic field generator comprises
a ring-shaped first magnetic body having a pole axis in a parallel direction with respect to a surface of the target,
a ring-shaped second magnetic body arranged on an inner side of the first magnetic body and having a pole axis in a parallel direction with the pole axis direction of the first magnetic body,
a magnetic permeable base supporting the first magnetic body and the second magnetic body from behind, and
a magnetic field distribution change member for changing a magnetic field distribution on a front surface of the target;
wherein the magnetic field distribution change member has (i) a width corresponding to a distance between the first magnetic body and the second magnetic body and (ii) a height perpendicular to the width and being uniform along the entire distance between the first magnetic body and the second magnetic body, and is arranged to be supported directly by the base from behind the first magnetic body and the second magnetic body,
wherein the first magnetic body, the second magnetic body and the magnetic field distribution change member are supported at different levels on the base while an upper surface of the magnetic field distribution change member is disposed at a level different from both upper surfaces of the first and second magnetic bodies.

18. The sputtering apparatus according to claim 17, wherein the level difference between the base end portions of the first and second magnetic bodies is 10 to 30% of the height of the first magnetic body.

* * * * *